United States Patent
Hong

(10) Patent No.: US 12,100,686 B2
(45) Date of Patent: Sep. 24, 2024

(54) METHOD FOR MANUFACTURING SEMICONDUCTOR PACKAGE STRUCTURE AND SEMICONDUCTOR MANUFACTURING APPARATUS

(71) Applicant: Advanced Semiconductor Engineering, Inc., Kaohsiung (TW)

(72) Inventor: Yun Di Hong, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/086,184

(22) Filed: Oct. 30, 2020

(65) Prior Publication Data

US 2022/0139866 A1 May 5, 2022

(51) Int. Cl.
*H01L 23/00* (2006.01)
*H01L 21/683* (2006.01)

(52) U.S. Cl.
CPC .......... *H01L 24/76* (2013.01); *H01L 21/6838* (2013.01); *H01L 24/96* (2013.01); *H01L 2224/76744* (2013.01); *H01L 2924/3511* (2013.01)

(58) Field of Classification Search
CPC ..... H01L 21/70; H01L 24/76; H01L 21/6838; H01L 24/96; H01L 2224/76744; H01L 2924/3511
See application file for complete search history.

(56) References Cited

U.S. PATENT DOCUMENTS

| | | | |
|---|---|---|---|
| 2003/0102682 A1* | 6/2003 | Kurokawa | H01L 21/6838 294/188 |
| 2010/0330332 A1* | 12/2010 | Quenzer | B81B 7/0067 65/106 |
| 2014/0065553 A1* | 3/2014 | Jang | H01L 21/6836 279/3 |

FOREIGN PATENT DOCUMENTS

| | | | | |
|---|---|---|---|---|
| CN | 107731787 A | * | 2/2018 | .......... H01L 21/108 |
| JP | H1050797 A | * | 7/1996 | |
| JP | 2008254132 A | * | 10/2008 | |
| JP | 2017188610 A | * | 10/2017 | ............. B28D 5/042 |
| KR | 20210070695 A | * | 6/2021 | |

* cited by examiner

*Primary Examiner* — Mohammad M Choudhry
(74) *Attorney, Agent, or Firm* — FOLEY & LARDNER LLP

(57) ABSTRACT

A method for manufacturing a semiconductor package structure and a semiconductor manufacturing apparatus are provided. The method includes: (a) providing a package body disposed on a chuck, wherein the package body includes at least one semiconductor element encapsulated in an encapsulant; and (b) sucking the package body through the chuck to create a plurality of negative pressures on a bottom surface of the package body sequentially from an inner portion to an outer portion of the package body.

20 Claims, 9 Drawing Sheets

METHOD FOR MANUFACTURING SEMICONDUCTOR PACKAGE STRUCTURE AND SEMICONDUCTOR MANUFACTURING APPARATUS

BACKGROUND

1. Field of the Disclosure

The present disclosure relates to a method for manufacturing a semiconductor package structure and a semiconductor manufacturing apparatus, and to a method including sucking steps and a semiconductor manufacturing apparatus for accomplishing the same.

2. Description of the Related Art

In order to reduce a thickness of a semiconductor package structure, a molded wafer that is in an intermediate state of fabrication is thinned. However, the molded wafer may include a semiconductor die and a molding compound covering the semiconductor die. The thinned molded wafer may have a severe warpage due to the small thickness of the thinned molded wafer, and the CTE mismatch between the semiconductor die and the molding compound. For the sake of performing subsequent steps on the warped molded wafer, the warped molded wafer are often disposed on a chuck and flattened through a plurality of suction holes of the chuck. However, the distance between the chuck and the warped molded wafer is too large, and the suction force is insufficient caused by all of the suction holes of the chuck act on the warped molded wafer at the same time. Thus, it is difficult to create a negative pressure or a vacuum between the chuck and the warped molded wafer. That is, the warped molded wafer cannot be effectively flattened by the above-mentioned suction method. Therefore, the subsequent steps may be difficult to be performed on the warped and thinned molded wafer.

SUMMARY

In some embodiments, a method for manufacturing a semiconductor package structure includes: (a) providing a package body disposed on a chuck, wherein the package body includes at least one semiconductor element encapsulated in an encapsulant; and (b) sucking the package body through the chuck to create a plurality of negative pressures on a bottom surface of the package body sequentially from an inner portion to an outer portion of the package body.

In some embodiments, a semiconductor manufacturing apparatus includes a chuck. The chuck includes an inner suction portion and an outer suction portion. The inner suction portion is configured for providing an inner suction force. The outer suction portion is configured for providing an outer suction force greater than the inner suction force of the inner suction portion.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
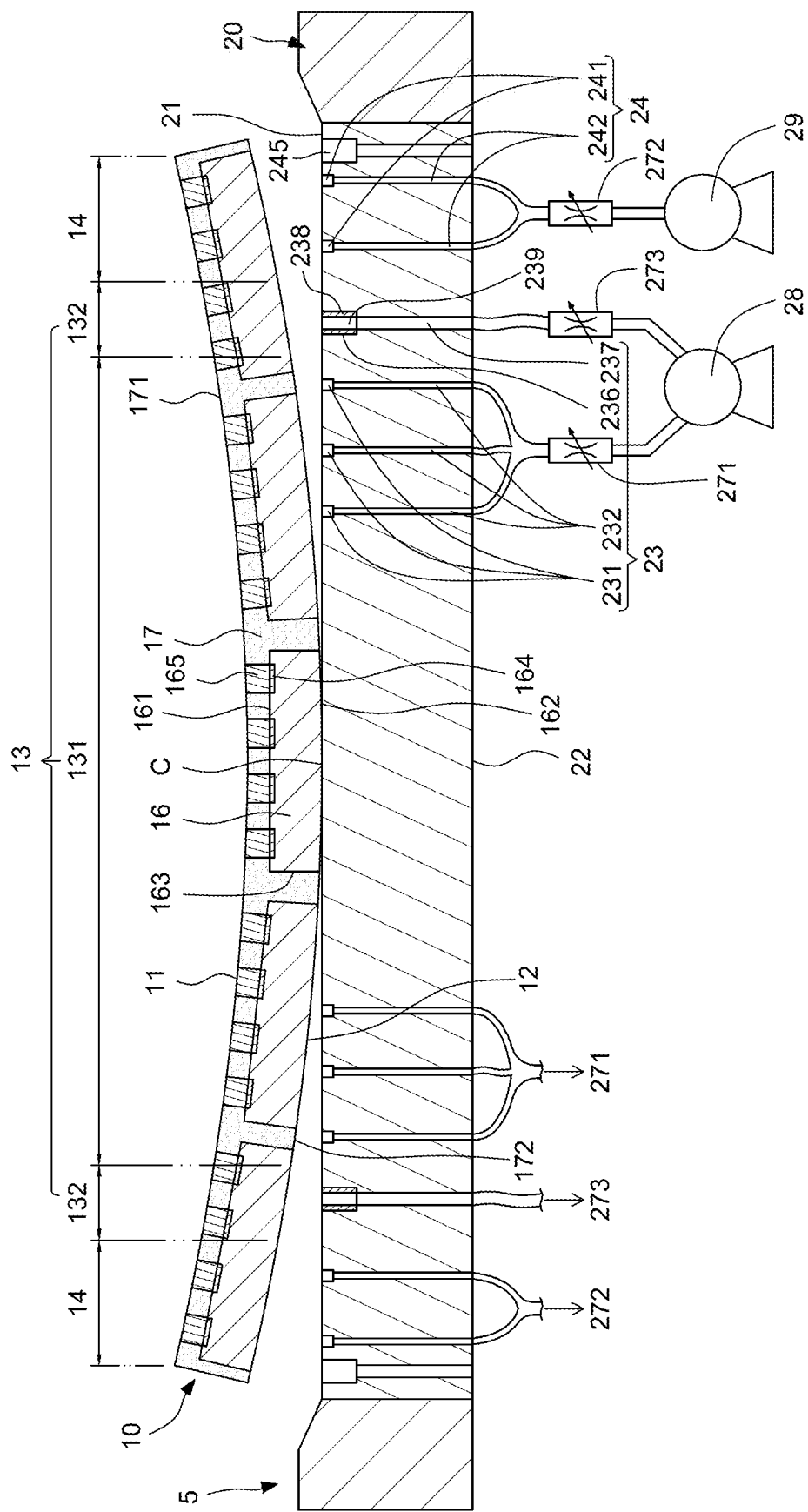
FIG. 1 illustrates a cross-sectional view of one or more stages of an example of a method for manufacturing a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
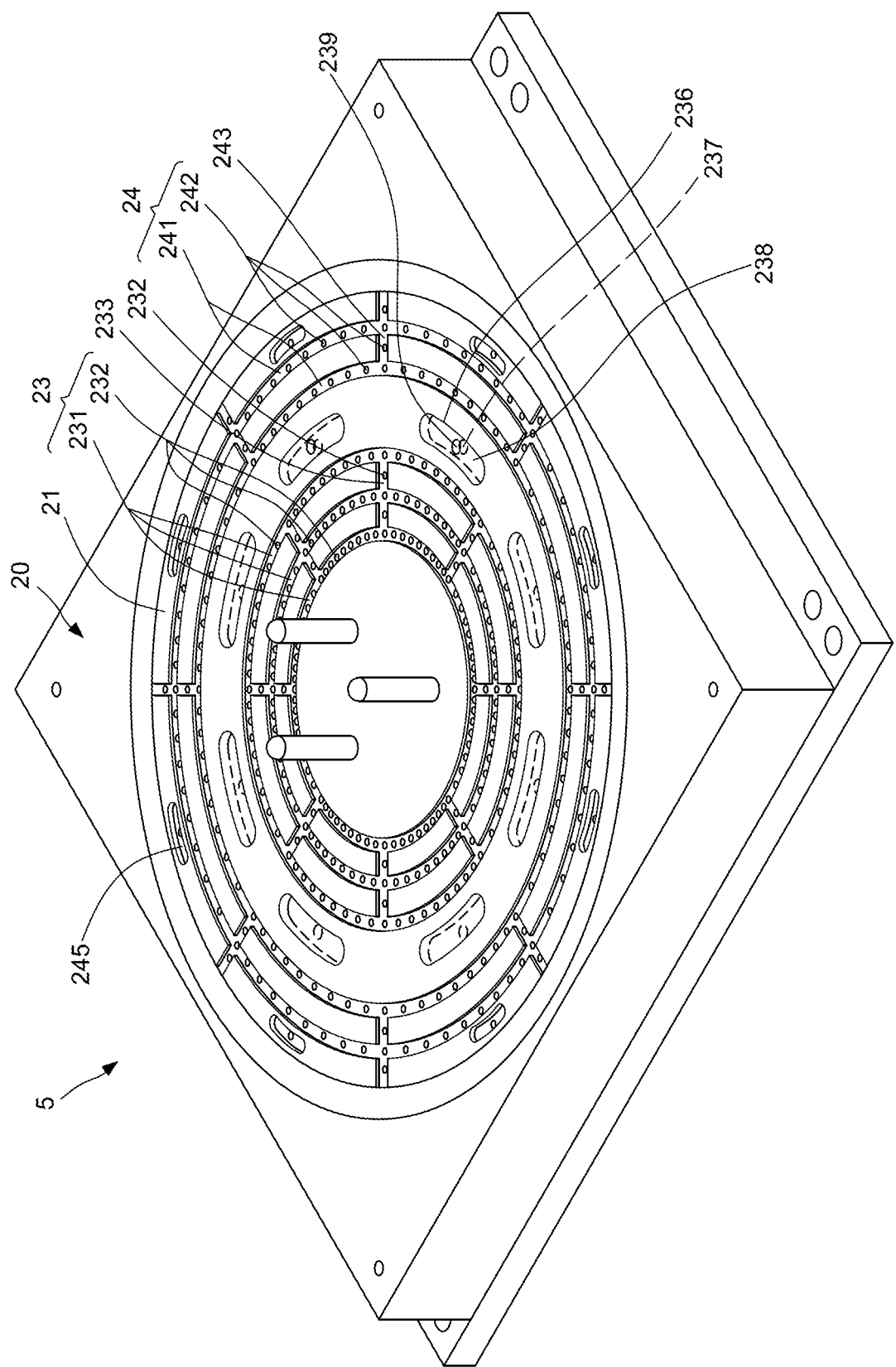
FIG. 2 illustrates a perspective view of an example of a semiconductor manufacturing apparatus according to some embodiments of the present disclosure.
Figure 3:
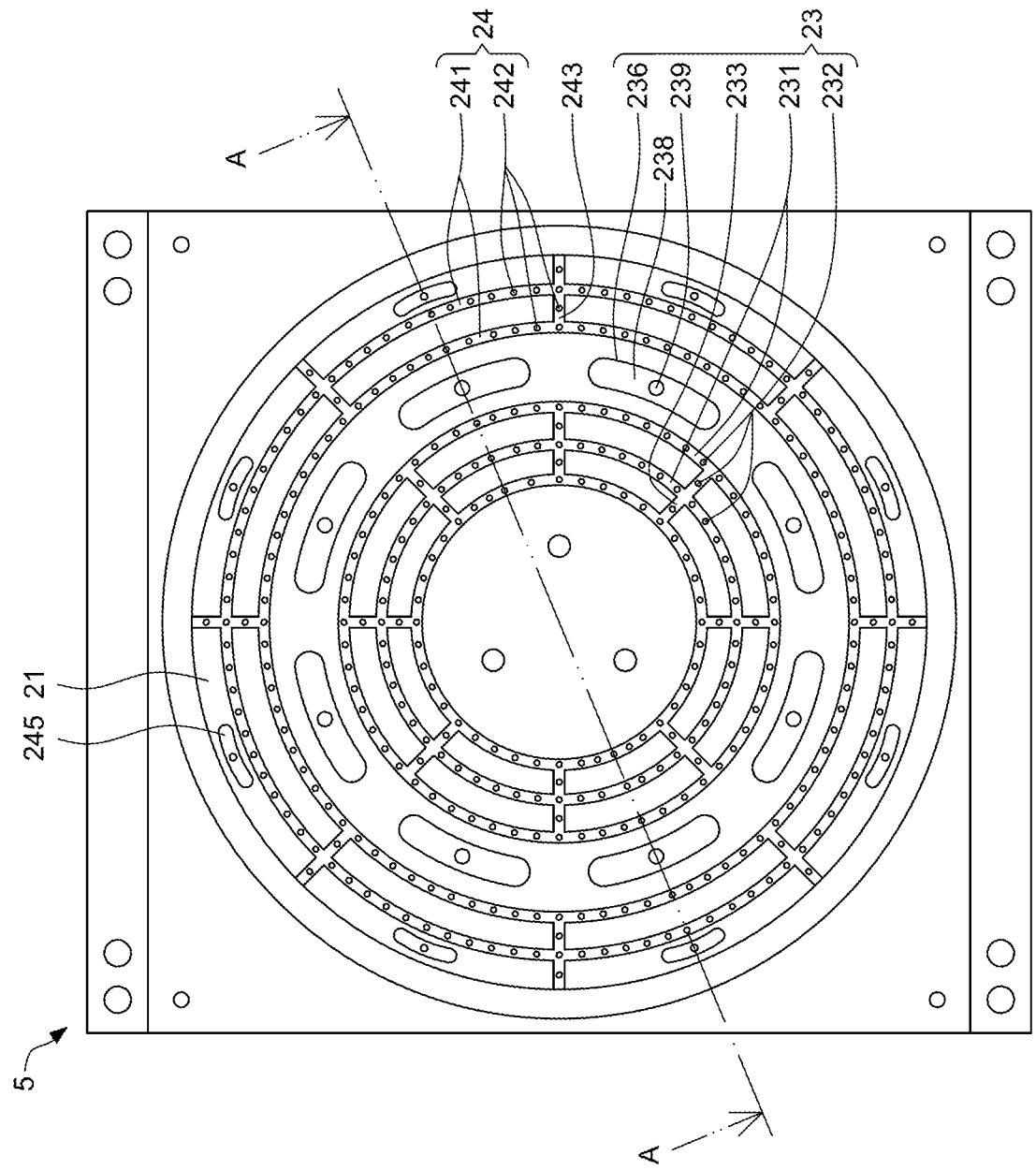
FIG. 3 illustrates a top view of FIG. 2.
Figure 4:
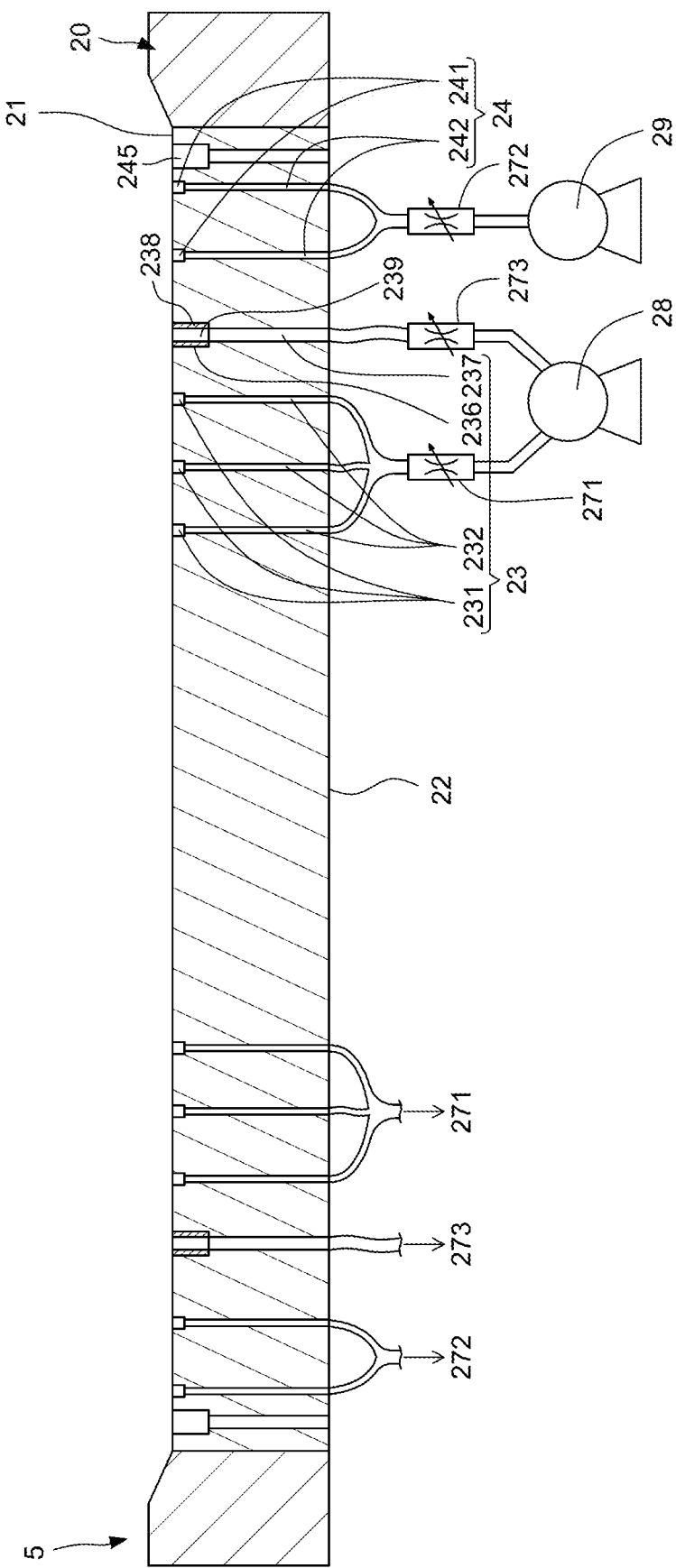
FIG. 4 illustrates a cross-sectional view taken along line A-A of the semiconductor manufacturing apparatus of FIG. 2.

FIG. 1 through FIG. 9 illustrate a method for manufacturing a semiconductor package structure according to some embodiments of the present disclosure. Referring to FIG. 1 through FIG. 4, wherein FIG. 2 illustrates a perspective view of an example of a semiconductor manufacturing apparatus 5 according to some embodiments of the present disclosure, FIG. 3 illustrates a top view of FIG. 2 and FIG. 4 illustrates a cross-sectional view taken along line A-A of the semiconductor manufacturing apparatus 5 of FIG. 2, a package body 10 and a semiconductor manufacturing apparatus 5 are provided. The semiconductor manufacturing apparatus 5 may be configured to suck the package body 10.

The package body 10 may be in a molded wafer type or in a molded panel type, and may have a top surface 11 and a bottom surface 12 opposite to the top surface 11. The package body 10 may include at least one semiconductor element 16 and an encapsulant 17. The at least one semiconductor element 16 may include a plurality of semiconductor dice 16 disposed side by side. The semiconductor element 16 has a top surface 161 (e.g., an active surface), a bottom surface 162 (e.g., a backside surface) and a lateral side surface 163. The second surface 162 is opposite to the top surface 161, and the lateral side surface 163 extends between the top surface 161 and the second surface 162. The second surface 162 of the semiconductor element 16 may be disposed adjacent to the semiconductor manufacturing apparatus 5. The semiconductor element 16 may include a plurality of conductive pads 164 and a plurality of stud bumps 165. The conductive pads 164 may include copper, aluminum or gold, and may be disposed adjacent to or exposed from the top surface 161 of the semiconductor element 16. The stud bumps 165 may be disposed on the conductive pads 164 and may protrude from the top surface 161 of the semiconductor element 16. In some embodiments, the stud bump 165 may include copper (Cu), and may be in a pillar form.

The encapsulant 17 may be a cured molding compound with or without fillers. The encapsulant 17 may cover the top surface 161 of the semiconductor element 16, the lateral side surface 163 of the semiconductor element 16 and the stud bumps 165 of the semiconductor element 16. Thus, the semiconductor element 16 is embedded or encapsulated in the encapsulant 17. The encapsulant 17 has a top surface 171 and a bottom surface 172 opposite to the top surface 171. In some embodiments, the top surface 171 of the encapsulant 17 may be ground, and the top surfaces of the stud bumps 165 may be substantially coplanar with the top surface 171 of the encapsulant 17. Thus, the top surfaces of the stud bumps 165 may be exposed from the top surface 171 of the encapsulant 17. The bottom surface 162 of the semiconductor element 16 may be substantially coplanar with the bottom surface 172 of the encapsulant 17, and they may be the bottom surface 12 of the package body 10.

In some embodiments, the package body 10 may have an inner portion 13, an outer portion 14 and a center C. The outer portion 14 is disposed around the inner portion 13. In some embodiments, the inner portion 13 may define a first area 131 and a second area 132 around the first area 131. The second area 132 may be between the first area 131 and the outer portion 14. As shown in FIG. 1, a warpage of the package body 10 may increase with increasing distance from the center C of the package body 10 to the periphery of the package body 10. That is, a distance (or gap) between the second area 132 and the chuck 20 may be greater than a distance (or gap) between the first area 131 and the chuck 20, and a distance (or gap) between the outer portion 14 and the chuck 20 may be greater than the distance (or gap) between the second area 132 and the chuck 20.

The semiconductor manufacturing apparatus 5 may include a chuck 20, a first exhaust valve 271, a second exhaust valve 272, a third exhaust valve 273, a first outgassing apparatus 28 and a second outgassing apparatus 29. The package body 10 may be disposed on the chuck 20. In some embodiments, the bottom surface 12 of the package body 10 may be disposed adjacent to the chuck 20. The chuck 20 may be configured to place and suck the package body 10. The chuck 20 has an upper surface 21 and a lower surface 22 opposite to the upper surface 21, and may include an ninner suction portion 23 corresponding to the inner portion 13 of the package body 10 and an outer suction portion 24 corresponding to the outer portion 14 of the package body 10.

The inner suction portion 23 may be configured for providing an inner suction force and sucking the inner portion 13 (including, for example, the first area 131 and the second area 132) of the package body 10. In some embodiments, the inner suction force may include a first suction force and a second suction force. In some embodiments, as shown in FIG. 1, the inner suction portion 23 may include at least one first suction groove 231, a plurality of first through holes 232, a plurality of cavities 236, a plurality of suction holes 237 and a plurality of buffer pads 238. The at least one first suction groove 231 and the cavities 236 may be recessed from the upper surface 21 of the chuck 20. The at least one first suction groove 231 may be configured to provide the first suction force and to suck the first area 131 of the inner portion 13 of the package body 10, and the suction holes 237 may be configured to provide the second suction force and to suck the second area 132 of the inner portion 13 of the package body 10. That is, the first suction force is acted on the first area 131 of the inner portion 13, and the second suction force is acted on the second area 132 of the inner portion 13. In some embodiments, as shown in FIG. 3, the at least one first suction groove 231 may include a plurality of first suction grooves 231 spaced apart from each other along a radial direction and arranged in a manner of concentric circles. In addition, the first suction grooves 231 may be in communication with each other through a plurality of first radial grooves 233 spaced apart from each other. The first through holes 232 may be disposed inside and in communication with the first suction groove 231. As shown in FIG. 1, each of the first through holes 232 may be in communication with the first suction groove 231 and the lower surface 22 of the chuck 20. In addition, the first through holes 232 of the inner suction portion 23 may be connected to the first outgassing apparatus 28 through the first exhaust valve 271. In some embodiments, as shown in FIG. 3, the first through holes 232 may be disposed inside and in communication with the first radial grooves 233. In some embodiments, the first suction groove 231 may be in a ring shape. The cavities 236 may be spaced apart from each other and around the first suction groove 231. In some embodiments, the cavities 236 may be arranged in a ring, and a width of each of the cavities 236 may be greater than a width of the first suction groove 231. The suction holes 237 may be around the first suction groove 231. The suction holes 237 may also be arranged in a ring. Each of the suction holes 237 may be disposed inside and in communication with each of the cavities 236. As shown in FIG. 1, each of the suction holes 237 may be in communication with each of the cavities 236 and the lower surface 22 of the chuck 20. In addition, the suction holes 237 may be connected to the first outgassing apparatus 28 through the third exhaust valve 273. The buffer pads 238 may be configured to support the package body 10. Each of the buffer pads 238 may be disposed in each of the cavities 236. In some embodiments, each of the buffer pads 238 may include a through hole 239 extending through the buffer pad 28 and corresponding to the suction hole 237.

The outer suction portion 24 may be around the inner suction portion 23. The outer suction portion 24 may be configured to provide an outer suction force and to suck the outer portion 14 of the package body 10. In some embodiments, as shown in FIG. 1, the outer suction portion 24 may include at least one second suction groove 241, a plurality of second through holes 242 and a plurality of suction cavities 245. The at least one second suction groove 241 and the suction cavities 245 may be recessed from the upper surface 21 of the chuck 20. In some embodiments, as shown in FIG. 3, the at least one second suction groove 241 may include a plurality of second suction grooves 241 spaced apart from each other along a radial direction and arranged in a manner of concentric circles. In addition, the second suction grooves 241 may be in communication with each other through a plurality of second radial grooves 243 spaced apart from each other. The second through holes 242 may be disposed inside and in communication with the second suction groove 241. As shown in FIG. 1, each of the second through holes 242 may be in communication with the second suction groove 241 and the lower surface 22 of the chuck 20. In addition, the second through holes 242 of the outer suction portion 24 may be connected to the second outgassing apparatus 29 through the second exhaust valve 272. In some embodiments, as shown in FIG. 3, the second through holes 242 may be disposed inside and in communication with the second radial grooves 243. In some embodiments, the second suction groove 241 may be in a ring shape. The suction cavities 245 are disposed around the second suction groove 241. In some embodiments, the suction cavities 245 may provide an additional suction force to suck the outer portion 14 of the package body 10.

As shown in the embodiment illustrated in FIG. 1, the inner suction portion 23 and the outer suction portion 24 may be connected to the first outgassing apparatus 28 and the second outgassing apparatus 29 through different exhaust valves (e.g., the first exhaust valve 271, the second exhaust valve 272 and the third exhaust valve 273), respectively. However, in some embodiments, the inner suction portion 23 and the outer suction portion 24 may be connected to the same outgassing apparatus through different exhaust valves (e.g., the first exhaust valve 271, the second exhaust valve 272 and the third exhaust valve 273).

Figure 5:
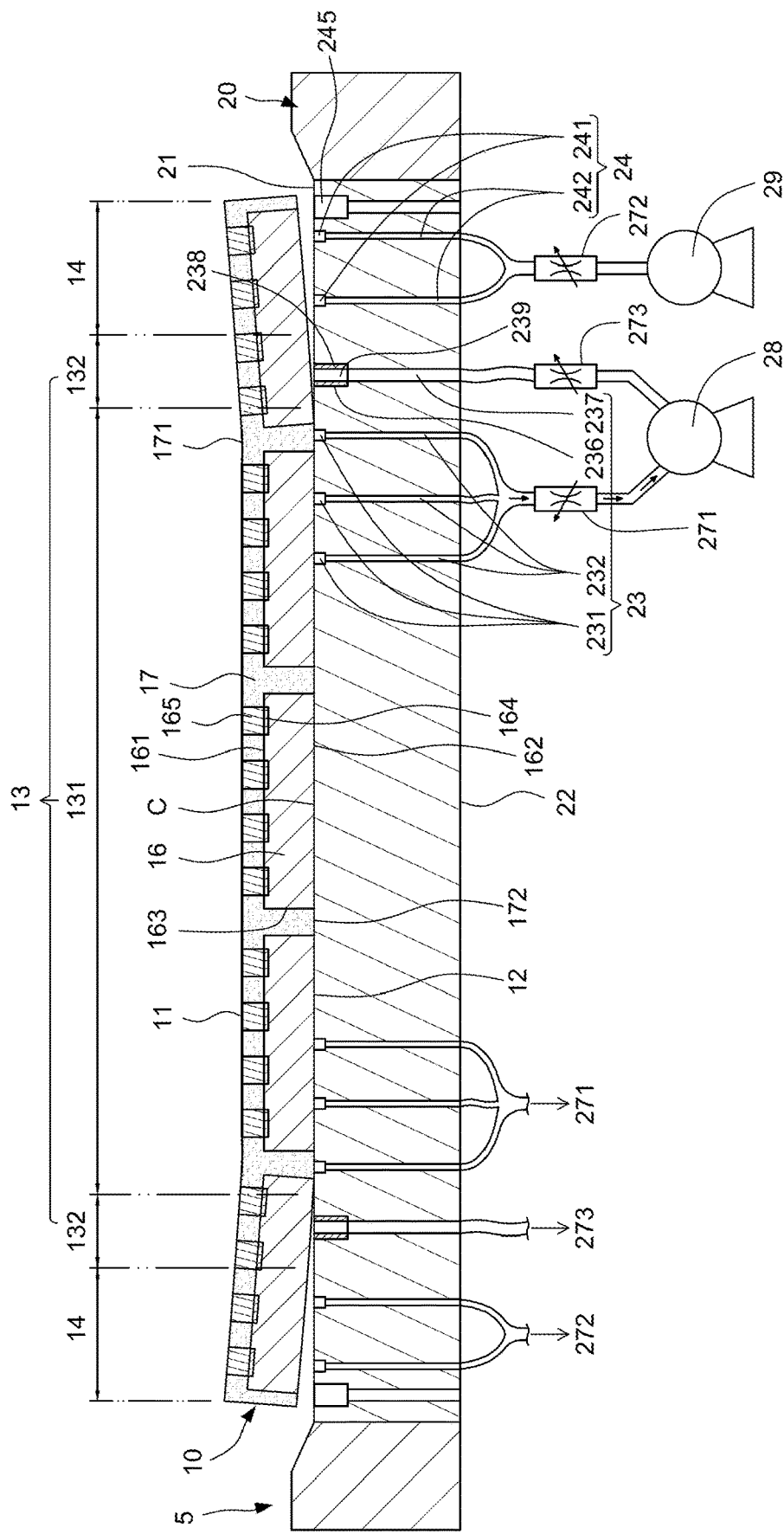
FIG. 5 illustrates a cross-sectional view of one or more stages of an example of a method for manufacturing a semiconductor package structure according to some embodiments of the present disclosure.
Figure 6:
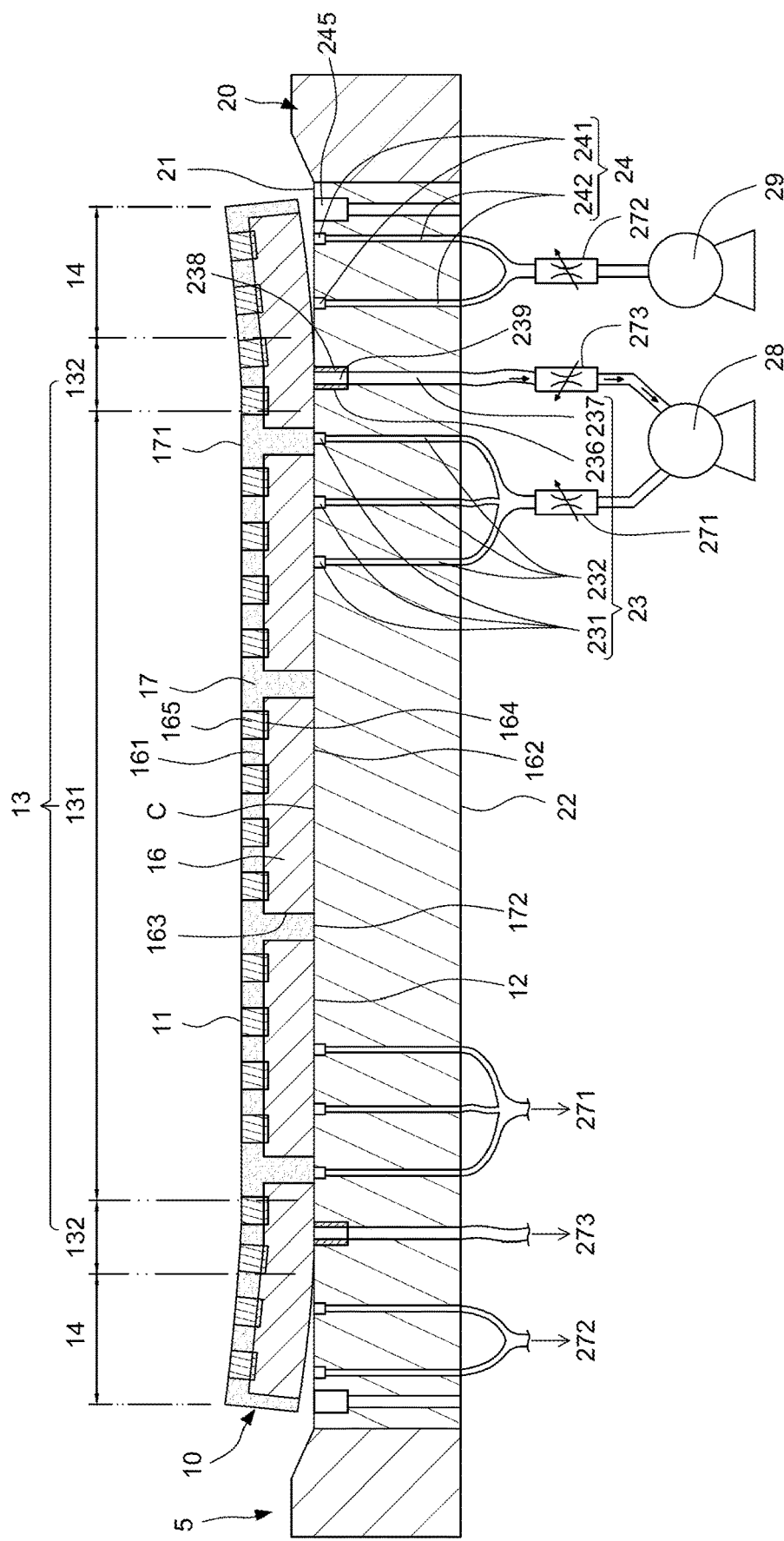
FIG. 6 illustrates a cross-sectional view of one or more stages of an example of a method for manufacturing a semiconductor package structure according to some embodiments of the present disclosure.
Figure 7:
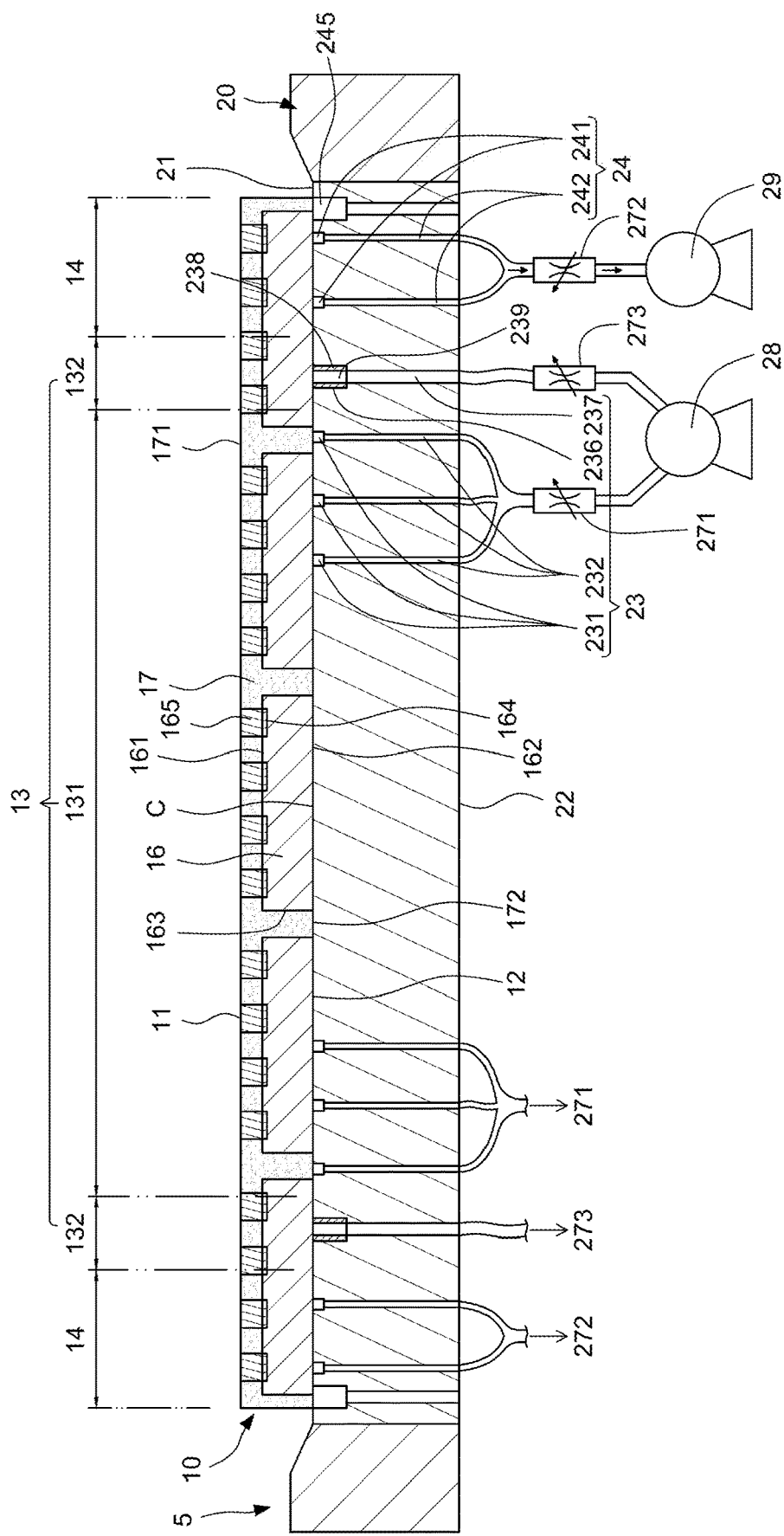
FIG. 7 illustrates a cross-sectional view of one or more stages of an example of a method for manufacturing a semiconductor package structure according to some embodiments of the present disclosure.

Referring to FIG. 5 through FIG. 7, the package body 10 is sucked through the chuck 20 of the semiconductor manufacturing apparatus 5 to create a plurality of negative pressures on the bottom surface 12 of the package body 10 sequentially from the inner portion 13 to the outer portion 14 of the package body 10. Referring to FIG. 5, the first area 131 of the inner portion 13 of the package body 10 is sucked through the first suction grooves 231 of the inner suction portion 23 of the chuck 20 to create a first suction force or a first negative pressure (e.g., lower than 1 atm) on the first area 131 of the package body 10. Meanwhile, the first area 131 of the package body 10 may be flattened through the first negative pressure. As shown in FIG. 5, the first negative pressure may be created through the first suction grooves 231, the first through holes 232, the first exhaust valve 271 (turn on) and the first outgassing apparatus 28 (turn on). In order to accelerate the creation of the first negative pressure, the third exhaust valve 273 may be turned off during the first exhaust valve 271 is turned on. Thus, the suction force from the first outgassing apparatus 28 may be concentrated on the first suction grooves 231 of the inner suction portion 23. After the first negative pressure is created (i.e., the first area 131 of the inner portion 13 of the package body 10 is sucked on the upper surface 21 of the chuck 20 completely), the first suction grooves 231 of the inner suction portion 23 may be covered or closed to keep the first negative pressure on the first area 131 of the package body 10. In some embodiments, the first suction grooves 231 of the inner suction portion 23 may be covered or closed by turning off the first exhaust valve 271.

Referring to FIG. 6, the second area 132 of the inner portion 13 of the package body 10 is sucked through the suction holes 237 of the inner suction portion 23 of the chuck 20 to create a second suction pressure or a second negative pressure (e.g., lower than 1 atm) on the second area 132 of the inner portion 13 of the package body 10. Meanwhile, the second area 132 of the package body 10 may be flattened through the second negative pressure. As shown in FIG. 6, the second negative pressure may be created through the suction holes 237, the third exhaust valve 273 (turn on) and the first outgassing apparatus 28 (turn on). In some embodiments, the second negative pressure may be created after the first negative pressure is created. In order to accelerate the creation of the second negative pressure, the first exhaust valve 271 may be turned off during the third exhaust valve 273 is turned on. Thus, the suction force from the first outgassing apparatus 28 may be concentrated on the suction holes 237 of the inner suction portion 23. After the second negative pressure is created (i.e., the second area 132 of the package body 10 is sucked on the upper surface 21 of the chuck 20 completely), the suction holes 237 of the inner suction portion 23 may be turned off to keep the second negative pressure on the second area 132 of the package body 10. In some embodiments, the suction holes 237 of the inner suction portion 23 may be covered or closed by turning off the third exhaust valve 273. In addition, the second negative pressure or the second suction force may be greater than the first negative pressure or the first suction force since the distance between the second area 132 and the chuck 20 is greater than the distance between the first area 131 and the chuck 20. For example, the second negative pressure may be about 0.6 atm, and the first negative pressure may be about 0.8 atm.

Referring to FIG. 7, the outer portion 14 of the package body 10 is sucked through the outer suction portion 24 (e.g., the second suction groove 241) of the chuck 20 (e.g., the outer suction force) to create a third suction pressure or a third negative pressure (e.g., lower than 1 atm) on the outer portion 14 of the package body 10. Meanwhile, the outer portion 14 of the package body 10 may be flattened through the third negative pressure. As shown in FIG. 7, the third negative pressure may be created through the second suction groove 241, the second through holes 242, the second exhaust valve 272 (turn on) and the second outgassing apparatus 29 (turn on). In some embodiments, the third negative pressure may be created after the first negative pressure is created and after the second negative pressure is created. That is, the second negative pressure may be created before the third negative pressure is created. After the third negative pressure is created (i.e., the outer portion 14 of the package body 10 is sucked on the upper surface 21 of the chuck 20 completely), the outer suction portion 24 may be turned off to keep the third negative pressure on the outer portion 14 of the package body 10. In some embodiments, the outer suction portion 24 may be turned off by turning off the second exhaust valve 272. Thus, the first negative pressure, the second negative pressure and the third negative pressure are not created concurrently. In addition, the third negative pressure (or the outer suction force acted on the outer portion 14) may be greater than the second negative pressure (or the second suction force acted on the second area 132 of the inner portion 13) since the distance between the outer portion 14 and the chuck 20 is greater than the distance between the second area 132 and the chuck 2. For example, the third negative pressure may be about 0.4 atm, and the second negative pressure may be about 0.6 atm. In some embodiments, the third negative pressure (or the outer suction force acted on the outer portion 14) may be greater than twice the second negative pressure (or the second suction force acted on the second area 132 of the inner portion 13). For example, the third negative pressure may be about 0.2 atm, and the second negative pressure may be about 0.6 atm. In some embodiments, the third negative pressure (or the outer suction force acted on the outer portion 14) may also be greater than the first negative pressure (or the first suction force acted on the first area 131 of the inner portion 13) since the distance between the outer portion 14 and the chuck 20 is greater than the distance between the first area 131 and the chuck 20. For example, the third negative pressure may be about 0.4 atm, and the first negative pressure may be about 0.8 atm. In some embodiments, the third negative pressure (or the outer suction force acted on the outer portion 14) may be greater than twice the first negative pressure (or the first suction force acted on the first area 131 of the inner portion 13). For example, the third negative pressure may be about 0.2 atm, and the first negative pressure may be about 0.8 atm. In some embodiments, the outer suction force acted on the outer portion 14 of the package body 10 may be greater than twice the inner suction force (a sum of the first suction force and the second suction force) acted on the inner portion 13 of the package body 10.

As shown in the embodiment illustrated in FIG. 5 through FIG. 7, the negative pressures (including, for example, the first negative pressure, the second negative pressure and the third negative pressure) are created outward from the center C of the package body 10 in a manner of concentric circles in sequence. In addition, the negative pressures increase with increasing distance from the center C of the package body 10 to the periphery of the package body 10. That is, the suction force from the first outgassing apparatus 28 may be respectively concentrated on the first area 131 and the second area 132, and the suction force from the second outgassing apparatus 29 may be concentrated on the outer portion 14 of the package body 10 at different suction time to create different levels of negative pressure. Thus, the package body 10 may be sucked and flattened gradually and effectively though the negative pressure (including, for example, the first negative pressure, the second negative pressure and the third negative pressure). Accordingly, the subsequent steps may be easily to be conducted to the package body 10.

Figure 8:
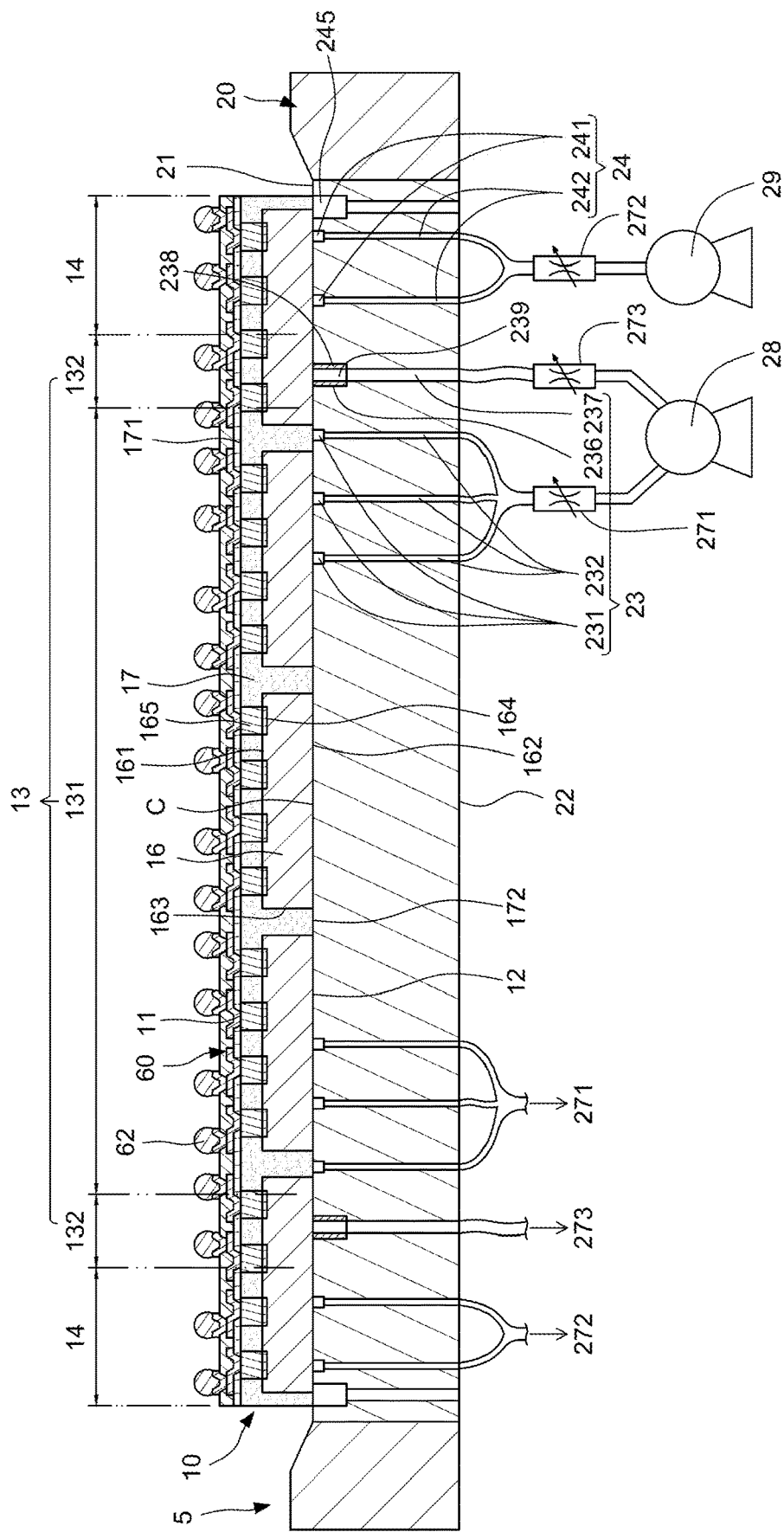
FIG. 8 illustrates a cross-sectional view of one or more stages of an example of a method for manufacturing a semiconductor package structure according to some embodiments of the present disclosure.

Referring to FIG. 8, a redistribution structure 60 may be formed on the package body 10. That is, at least one exposure step, at least one development step and at least one plating step may be performed on the package body 10 to form the redistribution structure 60. In some embodiments, a plurality of external connectors (e.g., solder balls) 62 may be formed on and electrically connected to the redistribution structure 60 for external connection.

Figure 9:
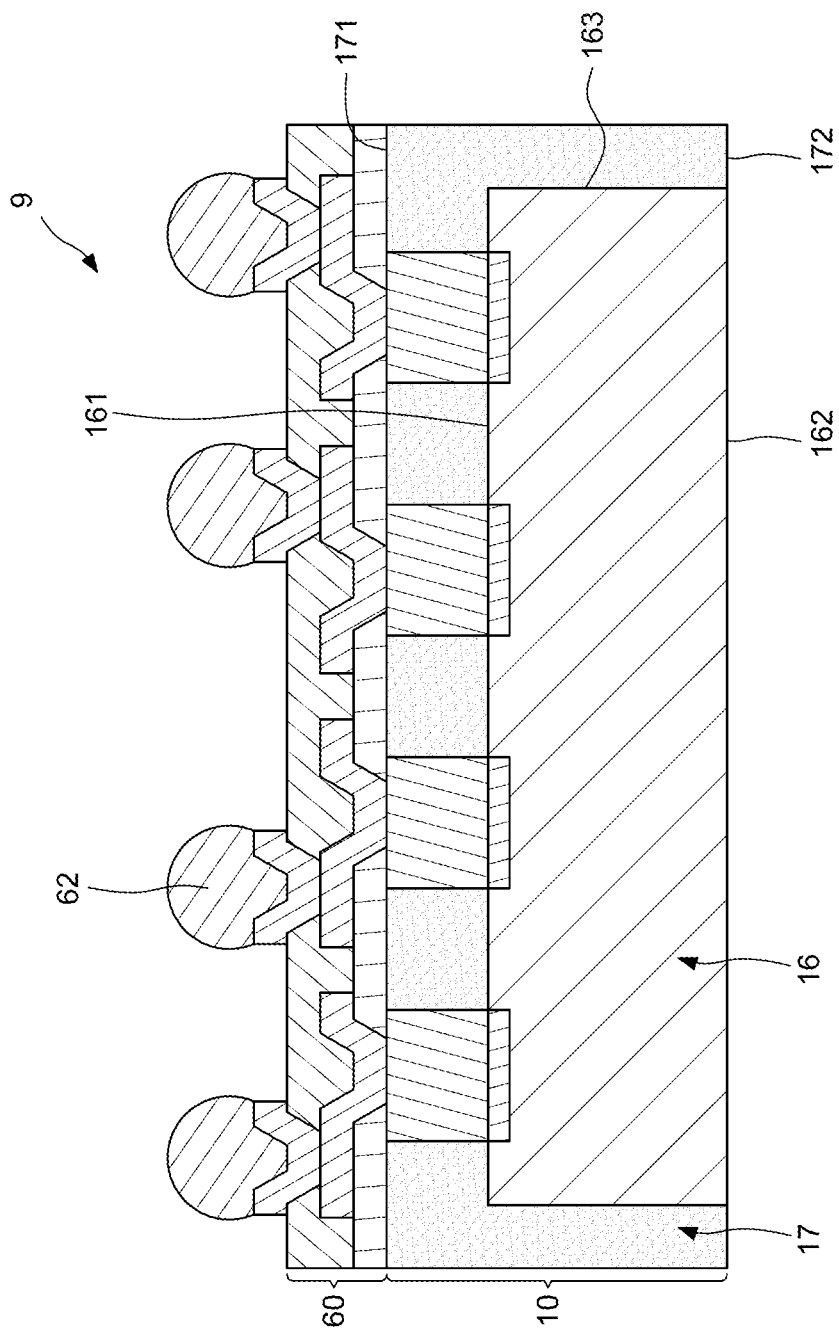
FIG. 9 illustrates a cross-sectional view of one or more stages of an example of a method for manufacturing a semiconductor package structure according to some embodiments of the present disclosure.

Referring to FIG. 9, the package body 10 and the redistribution structure 60 may be sawed or singulated to form a plurality of semiconductor package structures 9.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
    providing a package body disposed on a chuck, wherein a bottom surface of the package body facing a top surface of the chuck includes a first portion, a second portion around the first portion and an outer portion around the first portion and the second portion, and a first vertical distance between the first portion and the top surface of the chuck is less than a second vertical distance between the second portion and the top surface of the chuck;
    turning on a first valve to create a first negative pressure on the first portion;
    turning on a second valve to create a second negative pressure on the second portion;
    turning off the first valve after turning on the second valve;
    turning off the second valve after the second negative pressure is created; and
    turning on a third valve to create a third negative pressure on the outer portion of the package body after the second negative pressure is created.

2. A method for manufacturing a semiconductor package structure, comprising:
    providing a warped molded semiconductor substrate including a plurality of semiconductor elements spaced apart from each other and encapsulated by a molding compound over a top surface of a chuck, wherein a bottom surface of the warped molded semiconductor substrate facing the top surface of the chuck includes a first area and a second area distinguished from the first area, the second area is more adjacent to a periphery edge of the warped molded semiconductor substrate than the first area is, and the first area is more adjacent to the top surface of the chuck than the second area is;
    flattening the first area; and
    flattening the second area after flattening the first area.

3. A method for manufacturing a semiconductor package structure, comprising:
    providing a molded wafer including a plurality of semiconductor elements spaced apart from each other and encapsulated in a molding compound over a suction region of a top surface of a chuck, wherein the suction region of the top surface of the chuck and a corresponding portion of a bottom surface of the chuck opposite to the suction region are flat, wherein a bottom surface of the molded wafer faces the suction region of the top surface of the chuck and includes a first area and a second area, and a first elevation of the first area is lower than a second elevation of the second area with respect to the suction region of the top surface of the chuck; and
    forcing the molded wafer to make the first area contact the suction region of the top surface of the chuck and make the second area contact the suction region of the top surface of the chuck later than the first area contacts the suction region of the top surface of the chuck.

4. The method of claim 1, wherein turning off the first valve is performed before turning off the second valve.

5. The method of claim 4, wherein the second valve is turned off before the first portion is sucked on the top surface of the chuck.

6. The method of claim 1, wherein the first valve and the second valve are in communication with a same outgassing apparatus;
    wherein turning off the second valve and turning off the first valve are performed alternatively.

7. The method of claim 6, wherein turning on the third valve is performed after turning off the second valve.

8. The method of claim 6, wherein the third valve is in communication with a second outgassing apparatus independent from the first outgassing apparatus.

9. The method of claim 8, further comprising:
    turning off the third valve after turning off the second valve.

10. The method of claim 9, further comprising:
    forming a redistribution structure on the package body after turning off the third valve, wherein the package body contacts the chuck during forming the redistribution structure.

11. The method of claim 2, further comprising turning off one of a first valve and a second valve to concentrate a sucking force on the first area or on the second area, wherein the sucking force is created form an outgassing apparatus.

12. The method of claim 2, wherein the bottom surface of the warped molded semiconductor substrate further includes a third area more adjacent to the periphery edge of the warped molded semiconductor substrate and around the first area and the second area, and the method further comprises:
    flattening the third area after flattening the second area, wherein a first suction force is created to flatten the first area, a second suction force is created to flatten the second area, and a third suction force is created to flatten the third area, wherein the third suction force is greater than twice a sum of the first suction force and the second suction force.

13. The method of claim 12, wherein the first suction force and the second suction force are created from a first outgassing apparatus, and the third suction force is created from a second outgassing apparatus independent from the first outgassing apparatus.

14. The method of claim 13, wherein the second suction force is created from the first outgassing apparatus through a second suction hole of the chuck, and the third suction force is created from the second outgassing apparatus through a third suction hole of the chuck, wherein the third suction hole is closer to a periphery edge of the chuck than the second suction hole is, and a diameter of the second suction hole is greater than a diameter of the third suction hole.

15. The method of claim 13, wherein the first suction force is created from the first outgassing apparatus through a plurality of first suction holes of the chuck, and the third suction force is created from the second outgassing apparatus through a plurality of third suction holes of the chuck, wherein the plurality of third suction holes are closer to a periphery edge of the chuck than the plurality of first suction holes are, and a number of the plurality of first suction holes is greater than a number of the plurality of third suction holes in a cross-sectional view.

16. The method of claim 3, wherein forcing the molded wafer comprises making a first backside surface of a first one of the plurality of semiconductor elements co-level with a second backside surface of a second one of the plurality of semiconductor elements, wherein the first backside surface is exposed from the first area, and the second backside surface is exposed from the second area.

17. The method of claim 16, wherein the first one of the plurality of semiconductor elements has a first active surface opposite to the first backside surface, and the molding compound extends over and contacts the first active surface.

18. The method of claim 17, wherein the first one of the plurality of semiconductor elements includes a stud bump protruding beyond the first active surface, wherein a top surface of the molding compound facing away the chuck is co-level with a top surface of the stud bump.

19. The method of claim 3, wherein the step of forcing the molded wafer includes:
creating a first negative pressure between the first area and the chuck by turning on a first valve; and
creating a second negative pressure between the second area and the chuck by turning on a second valve;
wherein the second valve is turned off before the first area is sucked on the suction region of the top surface of the chuck.

20. The method of claim 19, further comprising:
turning off the first valve after turning on the second valve; and
turning off the second valve after the second area is sucked on the suction region of the top surface of the chuck.

* * * * *